(12) United States Patent
Lee

(10) Patent No.: US 9,576,849 B2
(45) Date of Patent: Feb. 21, 2017

(54) SEMICONDUCTOR PACKAGE AND METHOD FOR MANUFACTURING THE SAME

(71) Applicant: SK hynix Inc., Icheon-si, Gyeonggi-do (KR)

(72) Inventor: Ki Yong Lee, Seoul (KR)

(73) Assignee: SK HYNIX INC., Icheon-si (KR)

( * ) Notice: Subject to any disclaimer, the term of this patent is extended or adjusted under 35 U.S.C. 154(b) by 19 days.

(21) Appl. No.: 14/307,734

(22) Filed: Jun. 18, 2014

(65) Prior Publication Data
US 2015/0123288 A1   May 7, 2015

(30) Foreign Application Priority Data
Nov. 1, 2013   (KR) .................. 10-2013-0131880

(51) Int. Cl.
| | | |
|---|---|---|
| H01L 25/065 | (2006.01) | |
| H01L 21/768 | (2006.01) | |
| H01L 23/538 | (2006.01) | |
| H01L 23/00 | (2006.01) | |
| H01L 23/498 | (2006.01) | |
| H01L 23/31 | (2006.01) | |

(52) U.S. Cl.
CPC ..... *H01L 21/76879* (2013.01); *H01L 23/5389* (2013.01); *H01L 24/24* (2013.01); *H01L 24/82* (2013.01); *H01L 23/3121* (2013.01); *H01L 23/49816* (2013.01); *H01L 23/49894* (2013.01); *H01L 2224/24145* (2013.01); *H01L 2224/24227* (2013.01); *H01L 2224/32145* (2013.01); *H01L 2224/32225* (2013.01); *H01L 2224/73267* (2013.01); *H01L 2224/8203* (2013.01); *H01L 2924/15311* (2013.01); *H01L 2924/181* (2013.01)

(58) Field of Classification Search
CPC ............................ H01L 23/5389; H01L 24/24
See application file for complete search history.

(56) References Cited

U.S. PATENT DOCUMENTS

| | | | | |
|---|---|---|---|---|
| 2009/0134528 A1* | 5/2009 | Lee | ............... | H01L 21/486 257/777 |
| 2010/0193930 A1* | 8/2010 | Lee | ............... | H01L 23/49816 257/686 |

FOREIGN PATENT DOCUMENTS

| | | |
|---|---|---|
| KR | 1020110076189 A | 7/2011 |
| KR | 1020110105167 A | 9/2011 |

* cited by examiner

*Primary Examiner* — Fernando L Toledo
*Assistant Examiner* — Valerie N Newton
(74) *Attorney, Agent, or Firm* — William Park & Associates Ltd.

(57) ABSTRACT

The semiconductor package includes semiconductor chips, each chip having one or more bonding pads. The semiconductor chips are stacked in a stepped configuration over the surface of the substrate without covering one or more bonding pads. An encapsulation member encapsulates the stacked semiconductor chips on the surface of the substrate. Via wirings in the encapsulation member electrically connect to a bonding pad of at least one of the semiconductor chips. Redistributions are formed over the encapsulation member such that the one or more redistributions are electrically coupled to the via wirings.

9 Claims, 6 Drawing Sheets

SEMICONDUCTOR PACKAGE AND METHOD FOR MANUFACTURING THE SAME

CROSS-REFERENCES TO RELATED APPLICATIONS

The present application claims priority under 35 U.S.C. 119(a) to Korean patent application number 10-2013-131880 filed on Nov. 1, 2013, in the Korean Intellectual Property Office, which is incorporated herein by reference in its entirety.

TECHNICAL FIELD

The present disclosure generally relates to a semiconductor package, and more particularly, to a semiconductor package capable of minimizing an overall size thereof and a method for manufacturing the same.

BACKGROUND

Stacking a plurality of semiconductor chips in a single package increases a data storage capacity and enhances a data processing speed.

Manufacturing stacked type semiconductor packages involves stacking a plurality of semiconductor chips over a substrate and electrically connecting the stacked semiconductor chips with conductors such as metal wires.

Electrically connecting the semiconductor chips using the wires presents challenges. For example, due to wire bonding properties, realizing a fine pitch is difficult.

In addition, a sizable space may be needed between two adjoining semiconductor chips in order to prevent electrical shorts between adjacent semiconductor chips and the metal wires, which inevitably increases the thickness of the semiconductor package.

SUMMARY

A semiconductor package according to an embodiment comprises: a first semiconductor chip and a second semiconductor chip, each having one or more bonding pads, wherein the first and second semiconductor chips are stacked in a stepped configuration over a surface of a substrate without covering one or more bonding pads; an encapsulation member formed over the surface of the substrate to encapsulate the stacked semiconductor chips; a first via wiring and a second via wiring in the encapsulation member such that the first via wiring is electrically connected to a first bonding pad of the first semiconductor chip and the second via wiring is electrically connected to a second bonding pad of the second semiconductor chip; and a redistribution formed over the encapsulation member such that the redistribution electrically couples the first and second via wirings.

A device according to an embodiment comprises: a substrate having a first bond finger disposed over a surface of the substrate; a first semiconductor chip comprising a first bonding pad and disposed on the substrate without covering the first bond finger; a second semiconductor chip comprising a second bonding pad and disposed on the first semiconductor chip without covering the first bonding pad; a redistribution disposed above the second semiconductor chip; a first electrical conductor electrically coupled to the first bonding pad and the redistribution; a second electrical conductor electrically coupled to the second bonding pad and the redistribution; and a third electrical conductor electrically coupled to the first bond finger and the redistribution; wherein the redistribution electrically couples the first electrical conductor, the second electrical conductor, and the third electrical conductor.

A method of manufacturing a semiconductor package according to an embodiment comprises: stacking a first semiconductor chip having a first bonding pad and a second semiconductor chip having a second bonding pad over a surface of a substrate having a bond finger disposed over the surface of the substrate, wherein the second semiconductor chips are stacked in a stepped configuration without covering the bond finger and the first and second bonding pads; encapsulating the stacked first and second semiconductor chips with an encapsulation member formed over the surface of the substrate; forming a first via hole and a second via hole in the encapsulation member so as to expose the first and second bonding pads, respectively; forming a first via wiring in the first via hole and a second via wiring in the second via hole, wherein each of the first and second via wirings comprises a conductive material; forming a connection wiring comprising a conductive material electrically connected to the bond finger of the substrate; and forming a redistribution over the encapsulation member to electrically couple the first via wiring, the second via wiring, and the connection wiring.

DETAILED DESCRIPTION

Various embodiments of a semiconductor package and method for manufacturing the same will be described below with reference to the accompanying drawings.

Figure 1:
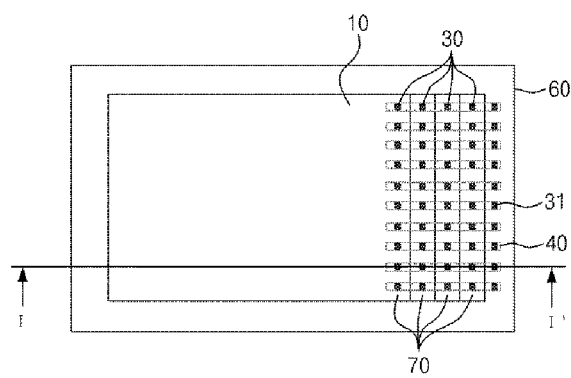
FIG. 1 is a plan view of a semiconductor package in accordance with an embodiment.
Figure 2:
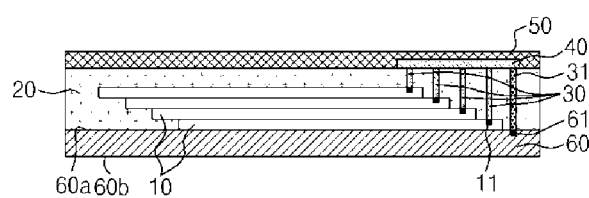
FIG. 2 is a cross-sectional view taken along the line I-I' of FIG. 1.

Referring to FIG. 1 and FIG. 2, a semiconductor package 100 in accordance with an embodiment includes, inter alia, a plurality of semiconductor chips 10 that are stacked in a stepped configuration as shown in FIG. 2, an encapsulation member 20 for encapsulating the semiconductor chips 10, a plurality of via wirings 30 (e.g., a conductive material), and a plurality of redistributions 40. The encapsulation member 20 may, for example, include a filler material. The via wirings 30, e.g., electrical conductors, pass through the encapsulation member 20 to electrically couple the bonding pads 11 of the semiconductor chips 10 and the redistributions 40.

At least two semiconductor chips 10 are stacked resulting in step surfaces 70, and one or more bonding pads 11 are disposed over each of the step surfaces 70. According to an embodiment, plural bonding pads 11 may be disposed along an edge of the upper surface of each of the semiconductor chips 10.

Alternatively, the bonding pads 11 may be disposed along the center of the upper surface of each of the semiconductor chips 10. Though not shown, when the bonding pads 11 are disposed along the center of each of semiconductor chip 10, a redistributing process may be performed for leading the bonding pads 11 out to the periphery of the semiconductor chip 10.

Figure 3:
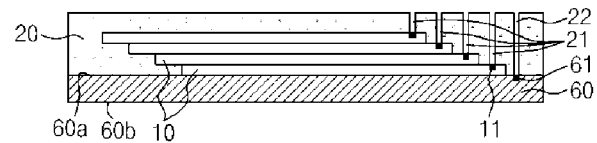
FIGS. 3 to 7 are cross-sectional views related to manufacturing of a semiconductor package in accordance with an embodiment.
Figure 4:
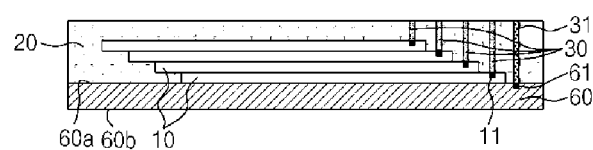

As shown in FIG. 2, the stacked semiconductor chips 10 are encapsulated by the encapsulation member 20. The encapsulation member 20 has a plurality of first via holes 21 inside thereof (see, e.g., FIG. 3). The first via holes 21 may be oriented to pass through the encapsulation member 20 at or near a ninety (90) degree angle with respect to the step surface 70 of the semiconductor chip 10 such as shown in FIG. 3 or at any other suitable angle not shown in the drawings. The first via holes 21 are formed for each of the bonding pads 11 to expose at least part of each bonding pad 11 of each semiconductor chip 10.

The via wiring 30 is formed or disposed in the first via hole 21 and is electrically coupled to the bonding pad 11. For example, the via wiring 30 may be formed by filling (or disposing or inserting) the first via hole 21, for example, with a conductive metal, such as copper, gold, tin, silver, and so forth, or a combination thereof.

The redistributions 40, for example, redistribution lines or redistribution layers, and so forth, are formed over the upper surface of the encapsulation member 20 to electrically couple the via wirings 30 to each other in a predetermined corresponding manner. The redistribution 40 may be parallel or substantially parallel to the upper surface of the chip 10 and over the encapsulation member 20 such that the redistribution 40 is electrically coupled to the upper ends of the via wirings 30.

A capping layer 50 may be formed over the upper surface of the encapsulation member 20 and may cover the redistributions 40. For example, the capping layer 50 may be formed of an insulating material such as a solder resist, among other insulating materials, to protect the redistributions 40 from an external impact and other destructive events.

As shown in FIG. 2, the semiconductor package 100 in accordance with an embodiment may further include a substrate 60 such that the lowermost semiconductor chip of the stacked semiconductor chips 10 is disposed thereon.

The substrate 60, which may include, inter alia, a printed circuit board, has a first surface 60a (also referred to as an upper surface 60a) and a second surface 60b (also referred to as a lower surface 60b). A plurality of bond fingers 61 may be disposed over the upper surface 60a of the substrate 60, and, although not shown, external connection terminals such as solder balls may be formed over the lower surface 60b.

The bond fingers 61 may be disposed outside the area of the upper surface 60a over which the encapsulation member 20 is formed. A plurality of second via holes 22 may be formed in the encapsulation member 20 at or near a ninety (90) degree angle or other suitable direction with respect to the upper surface 60a to expose the bond fingers 61. A connection wiring 31, such as an electrical conductor, may be filled or disposed in the second via hole 22 such that the connection wiring 31 is electrically connected to the redistribution 40 at one end and to the bond finger 61 at the connection wiring's 31 other end.

The redistribution 40, which is formed over the encapsulation member 20, electrically couples the via wirings 30 to the connection wiring 31 that corresponds to the via wirings 30. Multiple signals may be distributed among the semiconductor chips 10 via multiple redistributions 40, which may be adjacent to one another. For example, one signal is electrically coupled to each redistribution 40, e.g., each redistribution 40 electrically couples the bond finger 61 of the substrate 60 to a bonding pad 11 of each semiconductor chip 10 through the via wirings 30.

Below, manufacturing of a semiconductor package is described.

Referring to FIG. 3, the substrate 60 is formed with a plurality of the bond fingers 61 along the edge of and over the upper surface 60a of the substrate 60. Each semiconductor chip 10 comprises a plurality of bonding pads 11 formed along the edge of and over a step surface 70. A plurality of the semiconductor chips 10 are stacked over the upper surface 60a of the substrate 60 in a stepped configuration such that the bonding pads 11 formed on the stacked chips are exposed. For example, the semiconductor chips are stacked in a stepped configuration over a surface of a substrate without covering the bonding pads 11 or the bond fingers 61. The encapsulation member 20 is formed to encapsulate the stacked semiconductor chips 10, which are stacked over the upper surface 60a of the substrate 60, and the bond fingers 61.

The first via holes 21 may be formed, for example, using a drilling process, to extend from the upper surface of the encapsulation member 20 to the bonding pads 11 of the semiconductor chip 10 to expose at least part of each of the bonding pads 11. The second via holes 22 may be formed to extend from the upper surface of the encapsulation member 20 to the bond fingers 61 of the substrate 60 to expose at least part of each of the bond fingers 61. The first and second via holes 21 and 22 may be formed at the same time.

The first via holes 21 (see, e.g., FIG. 3) are filled with a conductive material, such as copper, gold, other metallic conductors, non-metallic conductors, or a combination thereof, to form the via wirings 30 that are coupled to the bonding pads 11 of each of the semiconductor chips 10. The second via holes 22 (see, e.g., FIG. 3) are filled with a conductive material, such as copper, gold, other metallic conductors, non-metallic conductors, or a combination thereof, to form the connection wirings 31 that are coupled to the bond fingers 61. The via wirings 30 and the connection wirings 31 may be formed at the same time.

Figure 5:
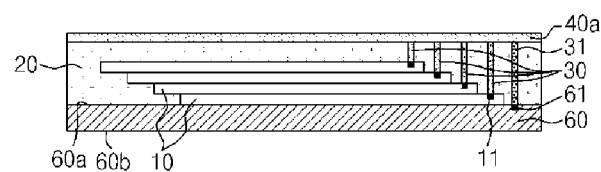

Referring to FIG. 5, a conductive layer 40a, for example, a metal layer, is formed over the entire upper surface of the encapsulation member 20. The conductive layer 40a may be formed, for example, by an electroplating process, an electroless plating process, or a deposition process. When forming the conductive layer 40a, the via wirings 30 and the connection wirings 31 are coupled to the conductive layer 40a.

Figure 6:
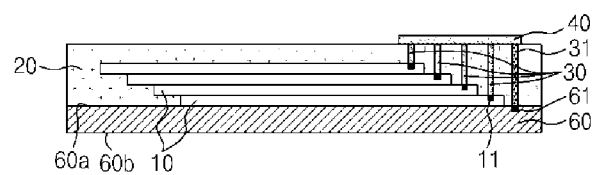

Referring to FIG. 6, the conductive layer 40a (see, e.g., FIG. 5) formed over the encapsulation member 20 is patterned to form one or more of the redistributions 40 as shown in FIG. 6. Each redistribution 40 is formed to extend, for example, from a via wiring 30 that is coupled to the bonding pad 11 of the uppermost semiconductor chip 10, e.g., the semiconductor chip 10 furthest away from the upper surface 60a of the substrate 60, to a connection wiring 31 coupled with the bond finger 61 of the substrate 60. A redistribution 40 electrically connects via wirings 30, their corresponding bonding pads 11 of the semiconductor chips 10, and the bond finger 61 of the substrate 60, resulting in a signal or reference voltage being distributed to each of the semiconductor chips 10.

Figure 7:
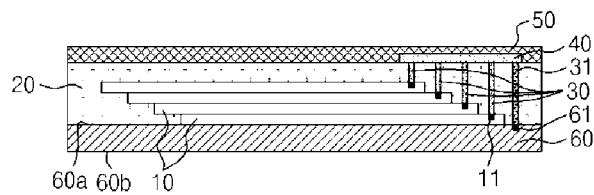

Referring to FIG. 7, the insulating material, such as a solder resist, is coated over the upper surface of the encapsulation member 20 and the redistributions 40 to form the capping layer 50.

As described above, the via wirings 30 and the connection wiring 31 that pass through the encapsulation member 20 are formed over the bonding pads 11 of the semiconductor chips 10 and the bond finger 61 of the substrate 60, respectively, such that the via wirings 30 and the connection wiring 31 are coupled to one another. The method and apparatus described herein (such as, for example, as shown in FIG. 2 through FIG. 7, utilize via wirings 30 and redistributions 40, among others) do not need to address margins for the bonding and loop height that would be required in other arrangements including connecting chips by wires. Thus, the overall size of the semiconductor package as set forth in this disclosure can be reduced.

Figure 8:
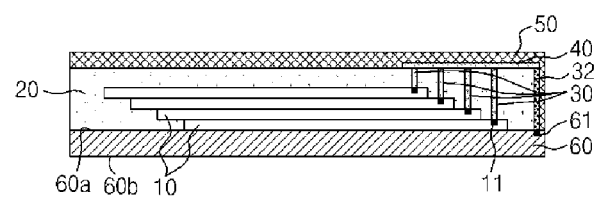
FIG. 8 is a cross-sectional view of a semiconductor package in accordance with an embodiment.

Now referring to FIG. 8, the semiconductor package according to an embodiment as shown in FIG. 8 includes a plurality of semiconductor chips 10 stacked in a stepped configuration, an encapsulation member 20 and a substrate 60, all of which may be same as an embodiment as described above with respect to previous FIG. 1 through FIG. 7. In the embodiment of FIG. 8, the bond fingers 61 of the substrate 60 are disposed over the upper surface 60a of the substrate 60 outside the encapsulation member 20, for example, on an outer surface of the encapsulation member 20.

Accordingly, the via wirings 30 may be formed in the first via holes 21 (as shown in FIG. 3) in the encapsulation member 20 so that the via wirings 30 are electrically coupled to the bonding pads 11 of each semiconductor chip 10. Unlike the via wirings 30 formed in the encapsulation member 20, the connection wiring 32 is formed outside the encapsulation member 20. For example, the connection wiring 32 may be formed over a side surface of the encapsulation member 20. The connection wiring 32 may extend from the redistribution 40 (formed over the upper surface of the encapsulation member 20) to the bond finger 61 (disposed over the upper surface 60a of the substrate 60) along a side surface of the encapsulation member, so that the connection wiring 32 is electrically connected to the bond finger 61. Therefore, the capping layer 50 may be formed over the upper surface and side surfaces of the encapsulation member 20 such that both the redistribution 40 and connection wiring 32 are covered by the capping layer 50.

The redistributions 40 electrically couple signals and/or reference voltages between multiple semiconductor chips. For example, a signal or reference voltage may electrically be coupled to one or more semiconductor chips and the substrate by a redistribution 40. Multiple redistributions, each arranged as described above, could electrically couple many signals to one or more semiconductor chips and the substrate. It is also possible that each redistribution may act as an electrical node for a signal, voltage, ground, and so forth.

The semiconductor package in accordance with an embodiment may be applied to a variety of semiconductor apparatus and package modules.

Figure 9:
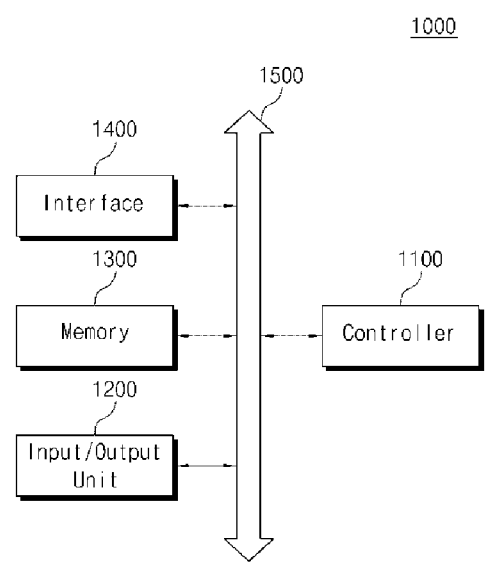
FIG. 9 is a block diagram showing an electronic system to which the semiconductor package in accordance with an embodiment is applied.

Referring to FIG. 9, the semiconductor package in accordance with various embodiments may be applied to an electronic system 1000. The electronic system 1000 may include a controller 1100, an input/output unit 1200, and a memory 1300. The controller 1100, the input/output unit 1200 and the memory 1300 may be coupled with one another through a bus 1500. The bus 1500 comprises paths that transport data.

The controller 1100 may include at least any one of the following: one or more microprocessors, one or more digital signal processors, one or more microcontrollers, and logic devices capable of performing the same functions as these components. The controller 1100 and the memory 1300 may include the stacked package as set forth by various embodiments. The input/output unit 1200 may include at least one selected among a keypad, a keyboard, a display device, a touch screen and so forth. The memory 1300 may store data and/or commands to be executed by the controller 1100 and the like.

The memory 1300 may include a volatile memory device and/or a nonvolatile memory device, such as a flash memory. For example, a flash memory to which the technology of the present invention is applied may be mounted to an information processing system such as a mobile terminal or a desktop computer. The flash memory may be constituted by a solid state drive (SSD). In such a case, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired (or wireless) transceiver. The electronic system may be provided with an application chipset, an input/output device and the like.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 1000 is a piece of equipment capable of performing wireless communication, the electronic system 1000 may be used in a communication system such as of CDMA (Code Division Multiple Access), GSM (Global System for Mobile Communication), NADC (North American Digital Cellular), E-TDMA (Enhanced-Time Division Multiple Access), WCDAM (Wideband Code Division Multiple Access), CDMA2000, LTE (Long Term Evolution) and Wibro (Wireless broadband Internet).

Figure 10:
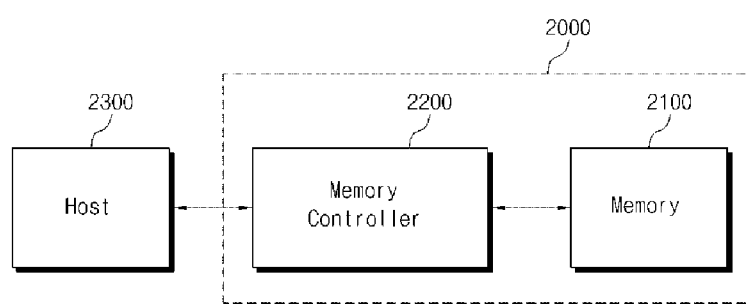
FIG. 10 is a block diagram illustrating a memory card which may include the semiconductor package in accordance with an embodiment.

Referring to FIG. 10, the semiconductor package in accordance with various embodiments may be provided in the form of a memory card 2000. For example, the memory card 800 may include a memory 2100 such as a nonvolatile memory device and a memory controller 2200. The memory 2100 and the memory controller 2200 may store data and/or read stored data.

The memory 2100 may include the stacked package in accordance with various embodiments of the present invention. The memory controller 2200 may control the memory 2100 such that stored data is read out or data is stored in response to a read/write request from a host 2300.

In an embodiment, an electronic system includes: a controller; memory coupled to the controller; the a first bond finger disposed on a substrate; a device comprising a first semiconductor chip comprising a first bonding pad and disposed on the substrate such that the first bond finger is exposed; a second semiconductor chip comprising a second bonding pad and disposed on the first semiconductor chip such that the first bonding pad is exposed; and a redistribution disposed above the second semiconductor chip. The device includes a first electrical conductor electrically coupled to the first bonding pad and the redistribution; a second electrical conductor electrically coupled to the second bonding pad and the redistribution; and a third electrical conductor electrically coupled to the first bond finger and the redistribution. The redistribution electrically couples the first electrical conductor, the second electrical conductor, and the third electrical conductor. The device is coupled to the controller.

In an embodiment, the electronic system includes: a bus coupled to each of the first semiconductor chip and the second semiconductor chip, wherein each path of bus comprises: a second bond finger disposed on a substrate; a third bonding pad disposed on the first semiconductor chip; a fourth bonding pad disposed on the second semiconductor chip; a second redistribution disposed above the second semiconductor chip; a fourth electrical conductor electrically coupled to the third bonding pad and the second redistribution; and a fifth electrical conductor electrically coupled to the fourth bonding pad and the second redistribution; a sixth electrical conductor electrically coupled to the second bond finger and the second redistribution. The second redistribution electrically couples the fourth electrical conductor, the fifth electrical conductor, and the sixth electrical conductor.

Relative terms, including but limited to, upper, uppermost, lower, lowermost, above, beneath, over, and under, for example, are used throughout the specification for the purposes of providing perspective or reference and are not otherwise limiting. For example, over includes on, adjacent to, to the side of, and so forth.

The above-disclosed subject matter is to be considered illustrative and not restrictive, and the appended claims are intended to cover all such physical orientations, modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the above detailed description.

What is claimed is:

1. A semiconductor package comprising:
   a substrate having a bond finger disposed on a surface of the substrate, wherein the substrate includes a printed circuit board;
   a first semiconductor chip and a second semiconductor chip, each having one or more bonding pads, wherein the first and second semiconductor chips are stacked in a stepped configuration over the surface of the substrate without covering the bond finger and one or more bonding pads;
   an encapsulation member formed over the surface of the substrate to encapsulate the stacked semiconductor chips;
   a first via wiring and a second via wiring in the encapsulation member such that the first via wiring is electrically connected to a first bonding pad of the first semiconductor chip and the second via wiring is electrically connected to a second bonding pad of the second semiconductor chip;
   a redistribution formed over the encapsulation member such that the redistribution electrically couples the first and second via wirings; and
   a connection wiring electrically connected to the bond finger and the redistribution.

2. The semiconductor package of claim 1, wherein the encapsulation member is formed to cover the bond finger, and wherein the connection wiring is formed in the encapsulation member to electrically connect the redistribution and the bond finger.

3. The semiconductor package of claim 1 further comprising:
   a capping layer formed over a surface of the encapsulation member to protect the redistribution.

4. The semiconductor package of claim 1, wherein the encapsulation member is formed without covering the bond finger, and wherein the connection wiring is formed over a surface of the encapsulation member to electrically connect to the redistribution and to the bond finger.

5. The semiconductor package of claim 4 further comprising:
   a capping layer formed over a surface of the encapsulation member to protect the redistribution and the connection wiring.

6. A device comprising:
   a substrate having a first bond finger disposed over a surface of the substrate, wherein the substrate includes a printed circuit board;
   a first semiconductor chip comprising a first bonding pad and disposed on the substrate without covering the first bond finger;
   a second semiconductor chip comprising a second bonding pad and disposed on the first semiconductor chip without covering the first bonding pad;
   a redistribution disposed above the second semiconductor chip;
   a first electrical conductor electrically coupled to the first bonding pad and the redistribution;
   a second electrical conductor electrically coupled to the second bonding pad and the redistribution; and
   a third electrical conductor electrically coupled to the first bond finger and the redistribution;
   wherein the redistribution electrically couples the first electrical conductor, the second electrical conductor, and the third electrical conductor.

7. The device of claim 6 further comprising:
   an encapsulation member disposed between the substrate and the redistribution.

8. The device of claim 6, wherein a plurality of holes are formed in the encapsulation member and wherein the first electrical conductor is disposed in a first hole of the plurality of holes, the second electrical conductor is disposed in a second hole of the plurality of holes, and the third electrical conductor is disposed in a third hole of the plurality of holes.

9. The device of claim 8 further comprising:
   a third semiconductor chip, wherein the first semiconductor chip, the second semiconductor chip, and the third semiconductor chip are stacked in a stepped configuration.

* * * * *